US012156392B1

(12) United States Patent
Liu

(10) Patent No.: US 12,156,392 B1
(45) Date of Patent: Nov. 26, 2024

(54) SELF-WRAPPING, MULTILAYER ABRASION AND EMI RESISTANT SLEEVE AND METHOD OF CONSTRUCTION THEREOF

(71) Applicant: FEDERAL-MOGUL POWERTRAIN LLC, Northville, MI (US)

(72) Inventor: Xiaoxiao Liu, Kanagawa (JP)

(73) Assignee: Federal-Mogul Powertrain LLC, Northville, MI (US)

( * ) Notice: Subject to any disclaimer, the term of this patent is extended or adjusted under 35 U.S.C. 154(b) by 0 days.

(21) Appl. No.: 18/220,546

(22) Filed: Jul. 11, 2023

(51) Int. Cl.
H05K 9/00 (2006.01)

(52) U.S. Cl.
CPC ........... *H05K 9/009* (2013.01); *H05K 9/0088* (2013.01); *H05K 9/0098* (2013.01)

(58) Field of Classification Search
CPC .................................................. H05K 9/0098
See application file for complete search history.

(56) References Cited

U.S. PATENT DOCUMENTS

| | | | | |
|---|---|---|---|---|
| 4,684,762 | A * | 8/1987 | Gladfelter | D03D 15/00 174/DIG. 11 |
| 7,395,680 | B2 * | 7/2008 | Baer | D04B 21/16 66/193 |
| 7,442,875 | B2 | 10/2008 | Emerson et al. | |
| 7,576,286 | B2 * | 8/2009 | Chen | D03D 1/0043 174/117 M |
| 8,283,563 | B2 * | 10/2012 | Harris | D03D 1/0041 174/117 M |
| 2002/0195260 | A1 * | 12/2002 | Marks | H05K 9/0098 174/351 |
| 2005/0124249 | A1 | 6/2005 | Uribarri | |
| 2007/0166495 | A1 * | 7/2007 | Sellis | D03D 15/587 428/36.1 |
| 2014/0251490 | A1 * | 9/2014 | Marcellin | D03D 1/0088 28/165 |

(Continued)

FOREIGN PATENT DOCUMENTS

| | | |
|---|---|---|
| CN | 212907168 U | 4/2021 |
| CN | 215868694 U | 2/2022 |

(Continued)

*Primary Examiner* — Hung V Ngo
(74) *Attorney, Agent, or Firm* — Robert L. Stearns; Dickinson Wright PLLC

(57) ABSTRACT

A wrappable, abrasion and EMI resistant sleeve for routing and protecting an elongate member from exposure to EMI, while further providing mechanical protection against abrasion, impact, and other environmental conditions, such as contamination. The sleeve includes a woven outer layer having opposite outer edges extending lengthwise between opposite ends of the woven outer layer. The woven outer layer includes warp filaments extending generally parallel to the opposite edges and weft filaments extending generally transversely to the warp filaments. The sleeve includes a textile inner layer having opposite inner edges extending lengthwise between opposite ends. The textile inner layer includes conductive filaments interlaced with one another in electrical communication with one another. The weft filaments of the woven outer layer are heat-formed to bias the opposite outer edges and the opposite inner edges into overlapping relation with one another.

20 Claims, 5 Drawing Sheets

(56) References Cited

U.S. PATENT DOCUMENTS

| | | | | |
|---|---|---|---|---|
| 2014/0262476 A1* | 9/2014 | Laurent | ............... | D03D 15/47 |
| | | | | 174/379 |
| 2014/0262478 A1* | 9/2014 | Harris | ............... | D03D 15/567 |
| | | | | 139/420 R |
| 2016/0021799 A1* | 1/2016 | Harris | ................ | D04C 1/06 |
| | | | | 87/9 |
| 2018/0287357 A1* | 10/2018 | Knudson | ............ | H02G 3/0481 |
| 2020/0154616 A1* | 5/2020 | Simeons-Seghers | ....................... | |
| | | | | D03D 15/513 |
| 2020/0294695 A1 | 9/2020 | Erlendsson | | |
| 2022/0215987 A1 | 7/2022 | Chen et al. | | |
| 2022/0394890 A1* | 12/2022 | Kim | ..................... | H05K 9/009 |

FOREIGN PATENT DOCUMENTS

| | | |
|---|---|---|
| DE | 20313526 U1 | 11/2003 |
| DE | 29825251 U1 | 5/2007 |

* cited by examiner

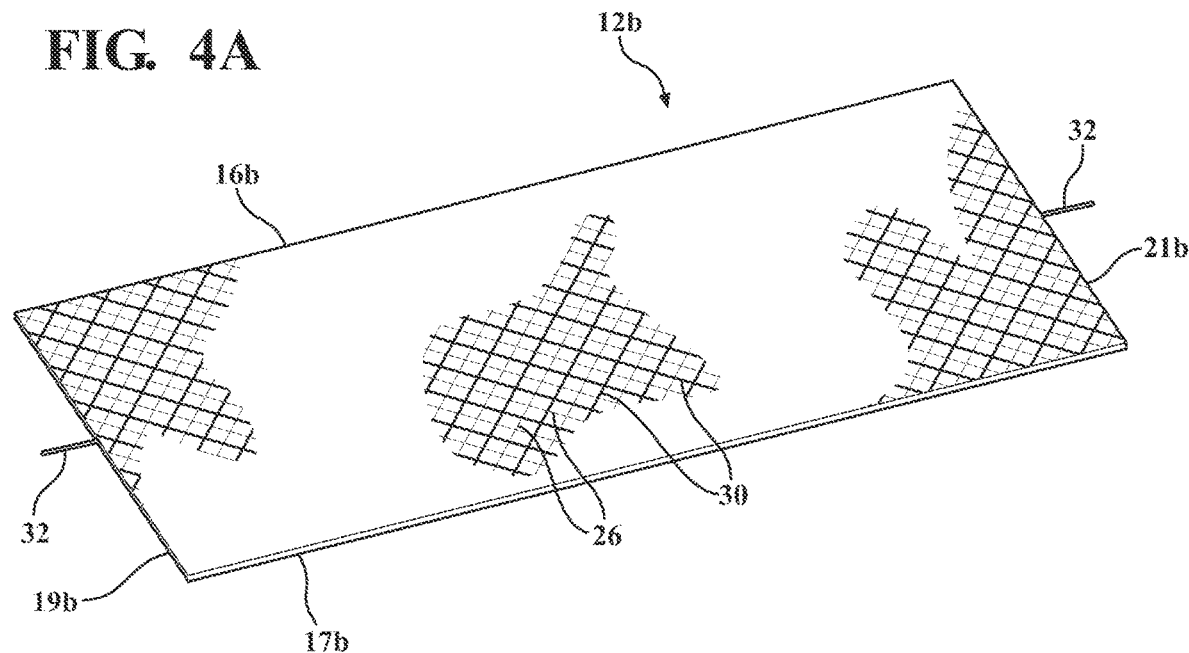
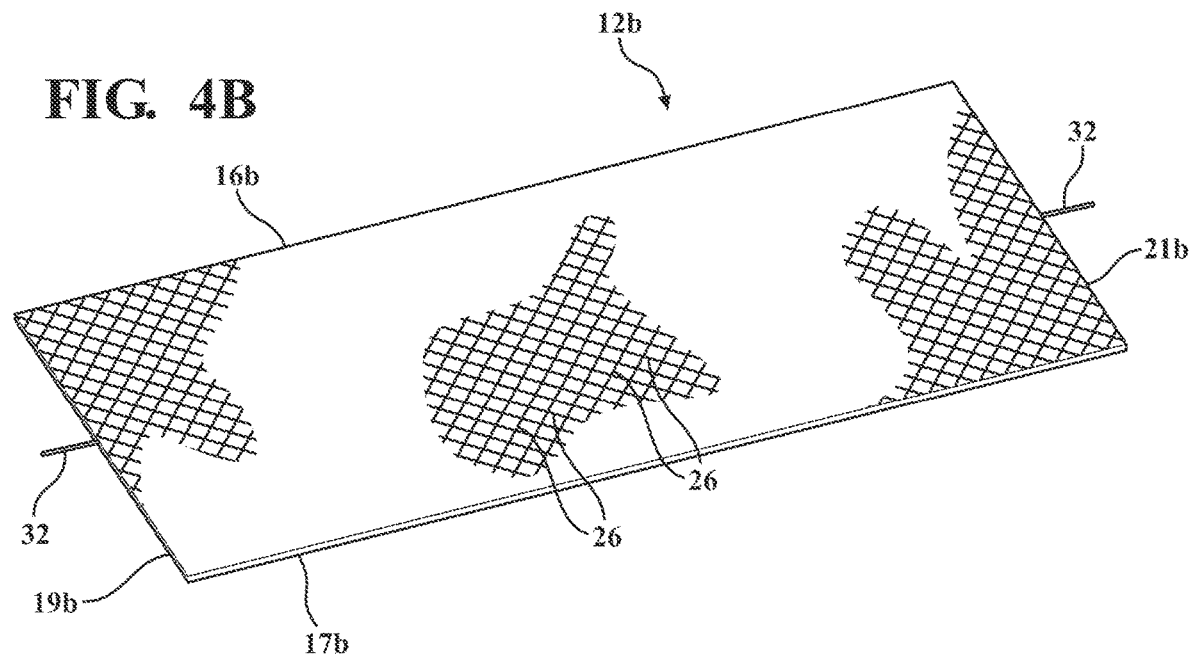

SELF-WRAPPING, MULTILAYER ABRASION AND EMI RESISTANT SLEEVE AND METHOD OF CONSTRUCTION THEREOF

BACKGROUND OF THE INVENTION

1. Technical Field

This invention relates generally to textile sleeves for protecting elongate members, and more particularly to self-wrapping, multilayered sleeves with abrasion resistant and electromagnetic interference resistant properties.

2. Related Art

It is known to contain and protect elongate members, such as wires and wire harnesses, for example, in wrappable woven sleeves to provide protection to the wires against electromagnetic interference (EMI). However, the sleeves are generally susceptible to wear from abrasion. Further yet, in addition to possessing abrasion resistance, in order to provide optimal protection in physically demanding environments, such as those encountered in motor vehicles, by way of example, the wrappable sleeve should also possess high durability, be impact resistant, while being flexible to allow the sleeve to be routed about corners and over meandering paths, while being lightweight.

SUMMARY OF THE INVENTION

One aspect of the invention provides a wrappable, abrasion and EMI resistant sleeve for routing and protecting an elongate member from exposure to EMI, while further providing mechanical protection against abrasion, impact, and other environmental conditions, such as contamination. The sleeve includes a woven outer layer having opposite outer edges extending lengthwise between opposite ends of the woven outer layer. The woven outer layer includes warp filaments extending generally parallel to the opposite edges and weft filaments extending generally transversely to the warp filaments. The sleeve includes a textile inner layer having opposite inner edges extending lengthwise between opposite ends. The textile inner layer includes conductive filaments interlaced with one another in electrical communication with one another. The weft filaments of the woven outer layer are heat-formed to bias the opposite outer edges and the opposite inner edges into overlapping relation with one another.

In accordance with another aspect of the invention, the woven outer layer is woven entirely with non-conductive filaments.

In accordance with another aspect of the invention, the conductive filaments of the inner layer are non-conductive filaments coated by a conductive coating.

In accordance with another aspect of the invention, the conductive filaments of the inner layer are braided with non-conductive filaments.

In accordance with another aspect of the invention, the non-conductive filaments of the inner layer are monofilaments.

In accordance with another aspect of the invention, the non-conductive filaments of the inner layer are multifilaments.

In accordance with another aspect of the invention, the textile inner layer is interlaced entirely with conductive filaments.

In accordance with another aspect of the invention, the conductive filaments are wire.

In accordance with another aspect of the invention, the woven outer layer and the textile inner layer are stitched to one another adjacent the opposite outer edges and the opposite inner edges.

In accordance with another aspect of the invention, the non-conductive filaments of the woven outer layer include monofilaments.

In accordance with another aspect of the invention, the non-conductive filaments of the woven outer layer include multifilaments.

In accordance with another aspect of the invention, the weft filaments are provided entirely as the monofilaments and the warp filaments are provided including the multifilaments.

In accordance with another aspect of the invention, the non-conductive filaments of the woven outer layer are entirely monofilaments.

In accordance with another aspect of the invention, the sleeve further includes a drain wire fixed to the textile inner layer in electrical communication with the inner layer.

In accordance with another aspect of the invention, the drain wire extends outwardly from at least one of the opposite ends of the sleeve for grounding of the sleeve to a suitable source of ground.

In accordance with another aspect of the invention, the drain wire is braided or twisted metal wire.

In accordance with another aspect of the invention, a method of constructing a self-wrapping, abrasion and EMI resistant sleeve for routing and protecting an elongate member is provided. The method includes weaving warp filaments with weft filaments to form an outer layer having opposite outer edges extending lengthwise between opposite ends, with the warp filaments extending generally parallel to the opposite edges and the weft filaments extending generally transversely to the warp filaments. Further, interlacing filaments to form a textile inner layer having opposite inner edges extending lengthwise between opposite ends, with at least some of the filaments of the textile inner layer including conductive filaments interlaced electrical communication with one another. Further yet, fixing the outer layer to the inner layer to form a wall, and, wrapping the wall about a central longitudinal axis to bring the opposite outer edges into overlapping relation with the opposite inner edges. Then, heat-forming the weft filaments of the woven outer layer to maintain the opposite outer edges and the opposite inner edges in biased overlapping relation with one another.

In accordance with another aspect of the invention, the method can further include weaving the outer layer entirely with non-conductive filaments.

In accordance with another aspect of the invention, the method can further include forming the textile inner layer by interlacing the conductive filaments of the inner layer with non-conductive filaments.

In accordance with another aspect of the invention, the method can further include interlacing the conductive filaments of the inner layer with non-conductive filaments in a braiding process.

In accordance with another aspect of the invention, the method can further include interlacing the conductive filaments of the inner layer with non-conductive filaments in a weaving process.

In accordance with another aspect of the invention, the method can further include forming the textile inner layer entirely with the conductive filaments.

In accordance with another aspect of the invention, the method can further include interlacing the inner layer formed entirely with conductive filaments in a weaving process.

In accordance with another aspect of the invention, the method can further include interlacing the inner layer formed entirely with conductive filaments in a braiding process.

In accordance with another aspect of the invention, the method can further include providing the conductive filaments as non-conductive filaments coated with a conductive material.

In accordance with another aspect of the invention, the method can further include providing the non-conductive filaments of the conductive filaments as monofilaments and/or multifilaments.

BRIEF DESCRIPTION OF THE DRAWINGS

These and other aspects, features and advantages will become readily apparent to those skilled in the art in view of the following detailed description of presently preferred embodiments and best mode, appended claims, and accompanying drawings, in which:

FIG. 4A is a perspective view of a braided inner layer in accordance with one aspect of the disclosure shown prior to being fixed to an outer layer:

FIG. 4B is a perspective view of a braided inner layer in accordance with another aspect of the disclosure shown prior to being fixed to an outer layer:

DETAILED DESCRIPTION OF PREFERRED EMBODIMENTS

Figure 1:
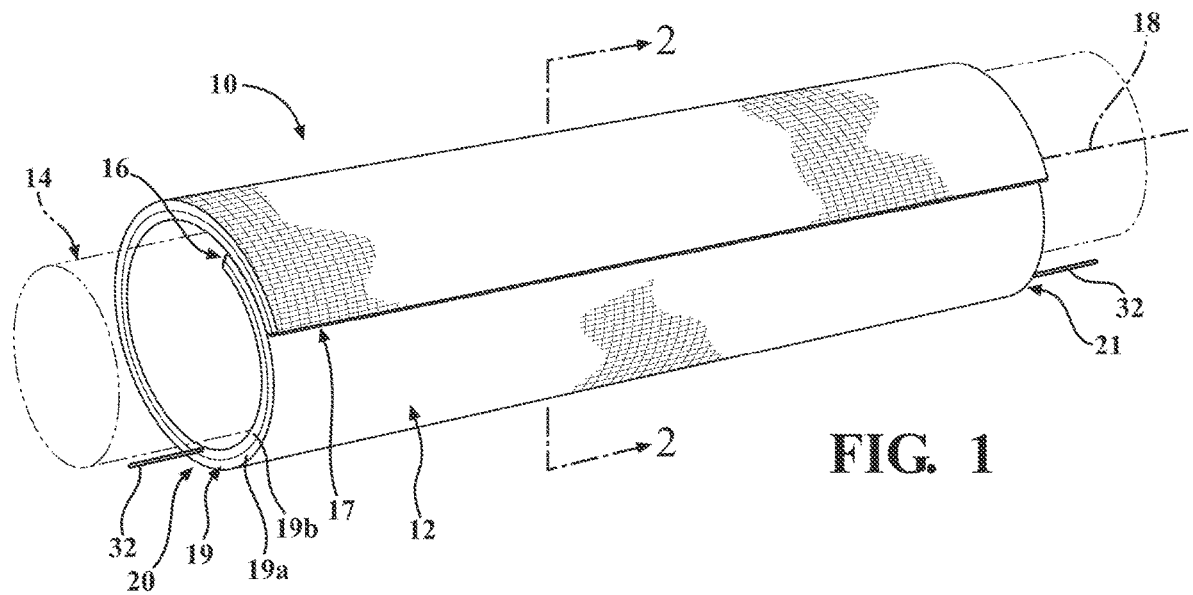
FIG. 1 is schematic perspective view of a self-wrapping, abrasion and EMI resistant sleeve constructed in accordance with one aspect of the invention, with the sleeve shown carrying and protecting an elongate member therein.

Referring in more detail to the drawings, FIG. 1 illustrates a schematic representation of self-wrapping, abrasion and EMI resistant sleeve, referred to hereafter as sleeve 10, constructed in accordance with one aspect of the invention.

Figure 2:
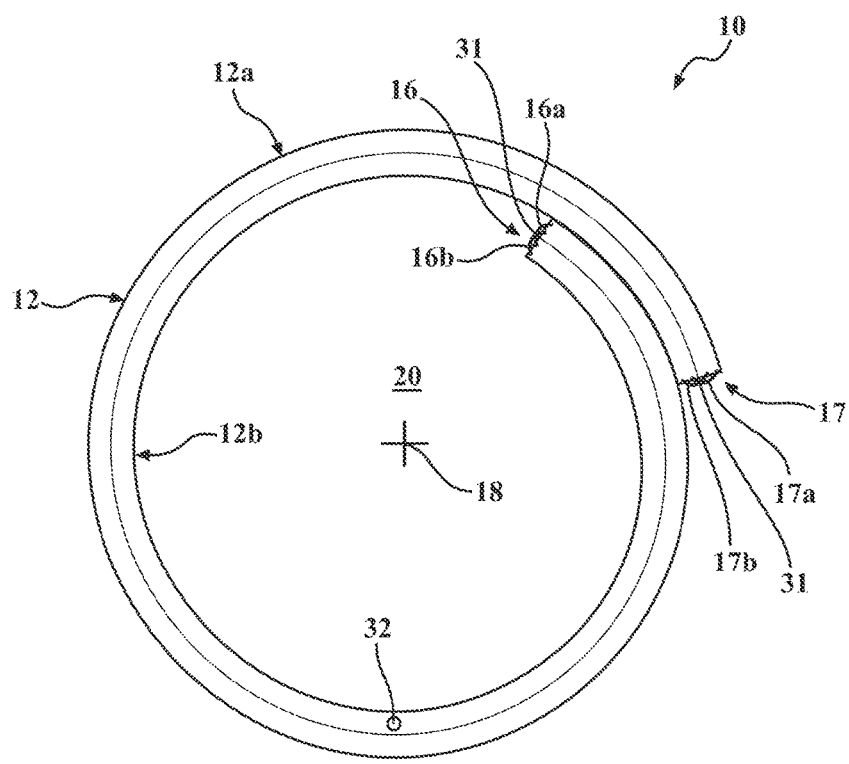
FIG. 2 cross-sectional view taken generally along line 2-2 of FIG. 1 shown prior to disposing the sleeve about the elongate member.
Figure 3A:
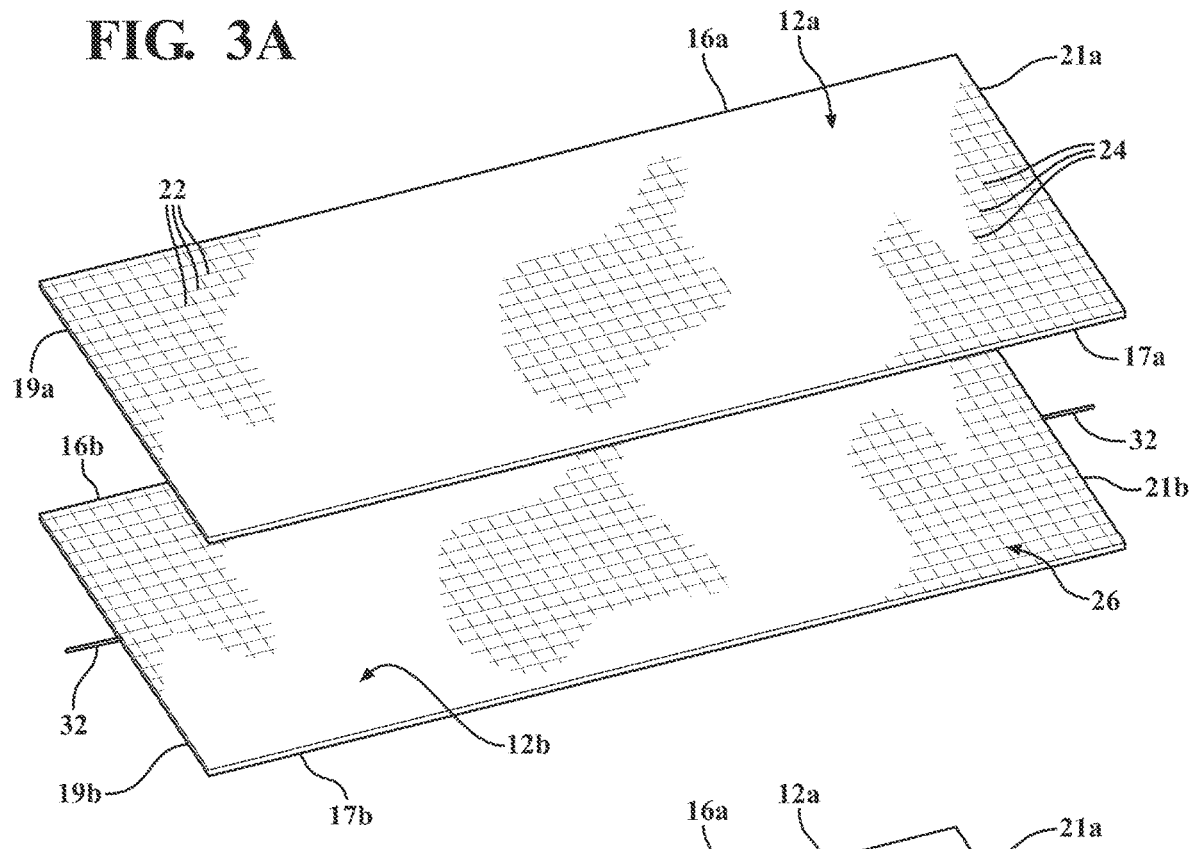
FIG. 3A is an exploded perspective view of an inner layer and an outer layer of the sleeve of FIG. 1 in accordance with one aspect of the disclosure shown prior to being fixed to one another and heat-formed into a self-wrapping configuration.
Figure 3B:
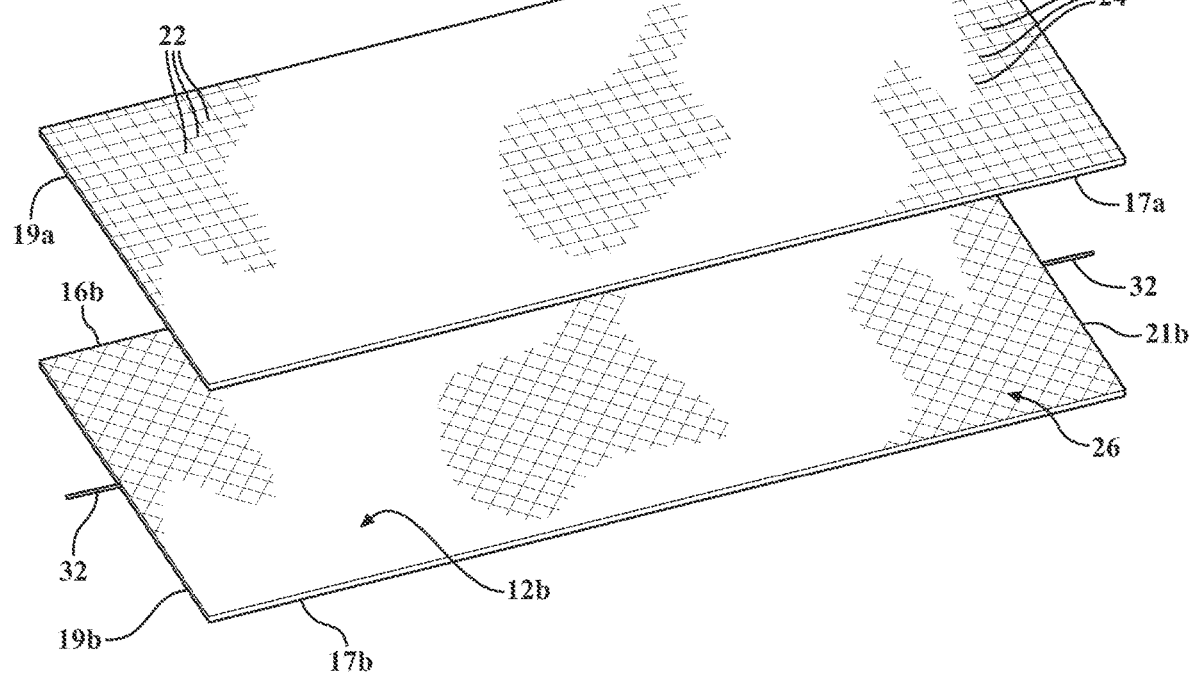
FIG. 3B is an exploded perspective view of an inner layer and an outer layer of the sleeve in accordance with another aspect of the disclosure shown prior to being fixed to one another and heat-formed into a self-wrapping configuration.

The sleeve 10 has a self-wrapping elongate wall 12 for routing and protecting an elongate member(s), such as wires or a wire harness 14, for example, from exposure to EMI, abrasion, impact, and other environmental conditions, such as contamination from fluid and debris. The elongate wall 12 has opposite edges 16, 17 extending parallel or generally parallel (meaning though not truly parallel, to a casual observer, the edges 16, 17 would be seen and described as being parallel) to a central, longitudinal axis 18 between opposite ends 19, 21, wherein the edges 16, 17 self-wrap into overlapping relation with one another in "cigarette wrapped" fashion to fully enclose the elongate members 14 within a central cavity 20 of the sleeve 10. The cavity 20 is readily accessible along the full length of the wall 12, via separation of the opposite edges 16, 17 away from one another, so that the elongate member(s) 14 can be readily disposed radially, relative the axis 18, into the cavity 20, and conversely, removed from the cavity 20, such as during service. As shown in FIGS. 2, 3A, and 3B, the sleeve 10 includes a woven outer layer 12a having opposite outer edges 16a, 17a extending lengthwise between opposite ends 19a, 21a of the woven outer layer 12a. The woven outer layer 12a includes warp filaments 22 extending generally parallel to the opposite edges 16a, 17a and weft filaments 24 extending generally transversely to the warp filaments 22. The sleeve 10 further includes a textile inner layer 12b having opposite inner edges 16b, 17b extending lengthwise between opposite ends 19b, 21b of the textile inner layer 12b. The textile inner layer 12b includes conductive filaments 26 interlaced with one another in electrical communication with one another. The weft filaments 24 of the woven outer layer 12a are heat-formed via a heat-forming process, while the wall 12 is wrapped about a suitably sized (diameter) mandrel, to bias the opposite outer edges 16a, 17a and the opposite inner edges 16b, 17b into overlapping relation with one another. The conductive filaments, and in accordance with one aspect of the disclosure, electrically conductive wire 26, such as having a diameter between about 0.05-0.2 mm, and in one non-limiting embodiment, a diameter between 0.8-1.2 mm, by way of example and without limitation, provide resistance to low frequency EMI, such as less than 100 MHz, and high frequency EMI, such as greater than 1 GHz. To maximize protection against low frequency EMI, the conductive filaments 26 can be provided as wire, including individual continuous wire filaments, or bundled wire filaments, such as mini-braids of continuous wire filaments. The wire 26 can be provided having a copper core encapsulated by an outer layer of tin, or copper coated nickel, by way of example and without limitation. The conductive filaments 26, and in accordance with another aspect of the disclosure, in one non-limiting embodiment, include a non-conductive filament, such as monofilament or a multifilament, coated with a conductive material, including any conductive metal.

The wall 12 can be constructed having any suitable size, including length and diameter, depending on the application.

Figure 6A:
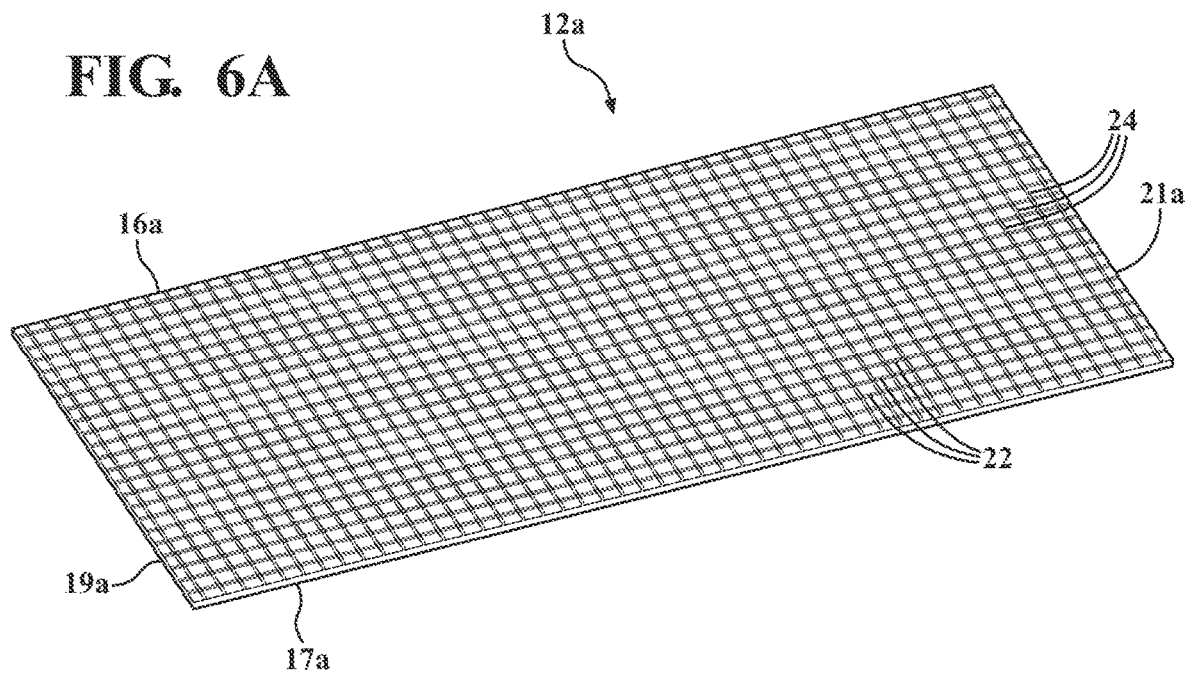
FIG. 6A is a perspective view of a woven outer layer in accordance with one aspect of the disclosure shown prior to being fixed to an inner layer.
Figure 6B:
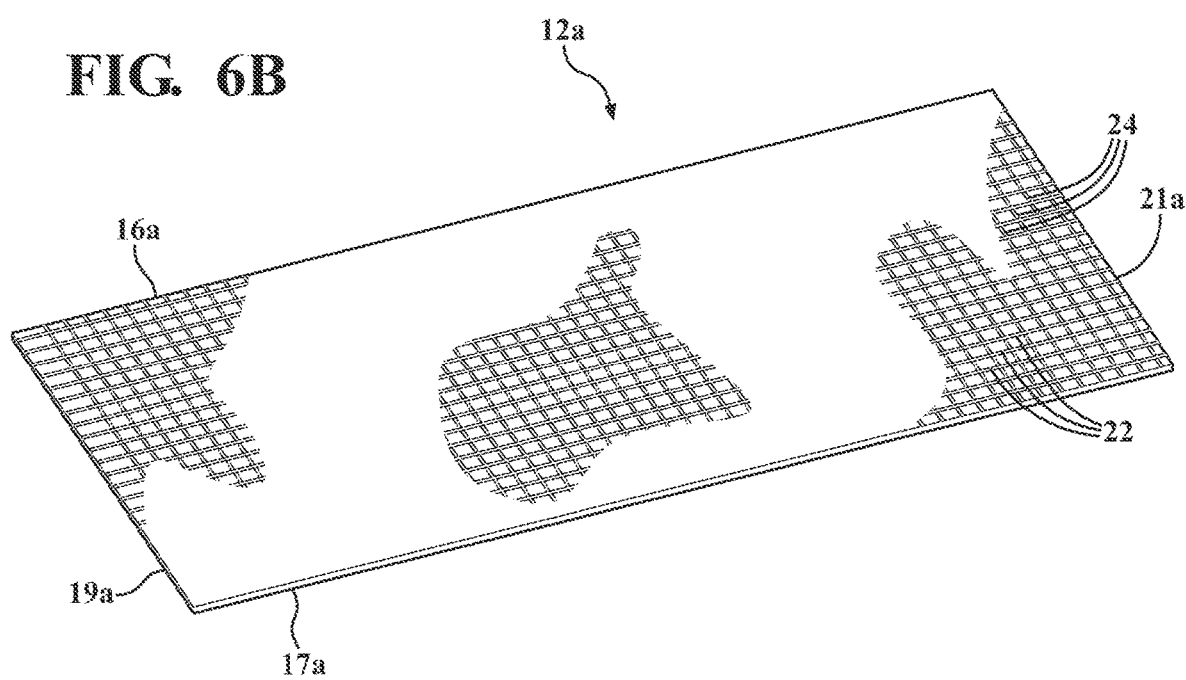
FIG. 6B is a perspective view of a woven outer layer in accordance with another aspect of the disclosure shown prior to being fixed to an inner layer.

The woven outer layer 12a is woven entirely with non-conductive filaments 28. The wall 12 is formed to be self-wrapping by providing at least some or all of the non-conductive weft filaments 24 of the outer layer 12a being heat-set (heat-formed) into a curled shape, as discussed above, to bias the opposite edges 16, 17 into overlapping relation with one another. The heat-set weft filaments 24 are provided as heat-settable monofilaments to maximize the self-curling bias upon being heat-set, and further, can be provided as a polyphenylene sulfide material to provide excellent balance of properties, including high temperature resistance, chemical resistance, flowability, dimensional stability and electrical characteristics. The wall 12, upon being formed by fixing the outer layer 12a and the inner layer 12b to one another, can be wrapped about a mandrel having a predetermined diameter, with the opposite edges 16, 17 brought into the desired overlapping relation with one another, and then a suitable heat can be applied to the wall 12 to cause the heat-settable weft yarns 24 of the outer layer 12a to be heat-set, whereupon the heat-set weft yarns 24 take on a curled shape having a radius of curvature of the mandrel, thereby providing a source of internal bias to the wall 12 to bias and maintain the opposite edges 16, 17 in overlapping relation with one another. Of course, the opposite edges 16, 17 can be spread apart from one another under a suitable externally applied force sufficient to overcome the bias imparted by the heat-set weft yarns 24, such as may be desired to install, service or replace the elongate member 14. The non-conductive warp filaments 22 of the outer layer 12a can be provided as multifilaments (FIG. 6A) and/or multifilaments (FIG. 6B), depending on whether enhanced abrasion resistance is desired (monofilaments of FIG. 6A) or enhanced coverage (multifilaments of FIG. 6B). It is to be recognized that the weft filaments 24 can be provided entirely as the monofilaments and the warp filaments can be provided entirely as the multifilaments, or, the weft filaments 24 can be provided entirely as the monofilaments and the warp filaments can be provided entirely as the monofilaments.

Figure 5A:
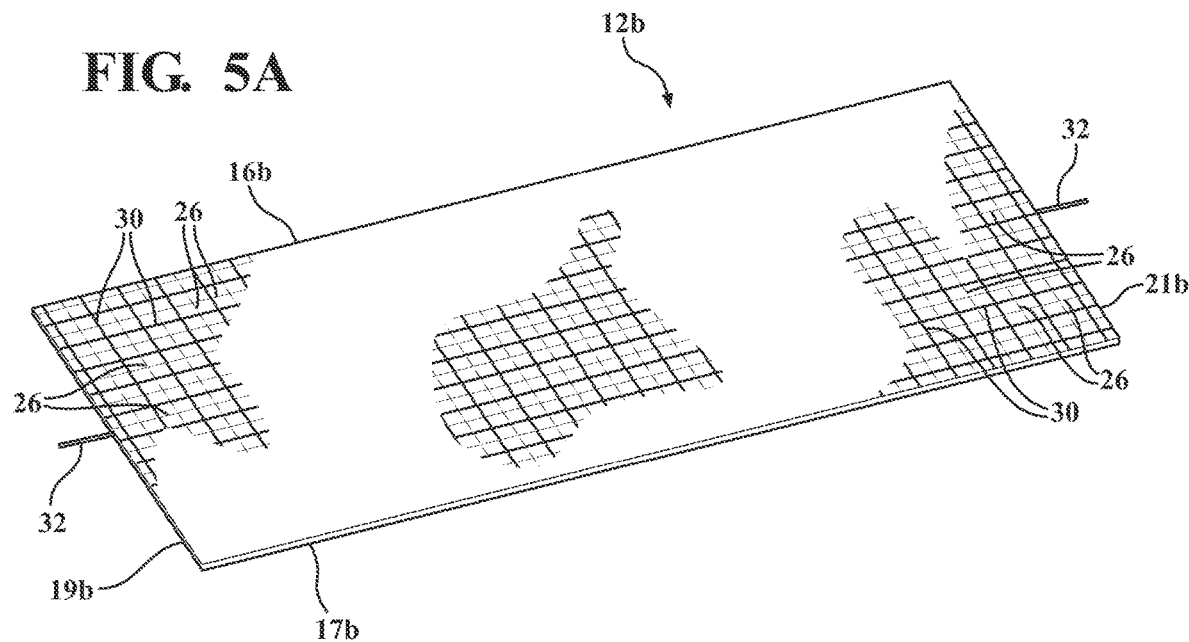
FIG. 5A is a perspective view of a woven inner layer in accordance with one aspect of the disclosure shown prior to being fixed to an outer layer.
Figure 5B:
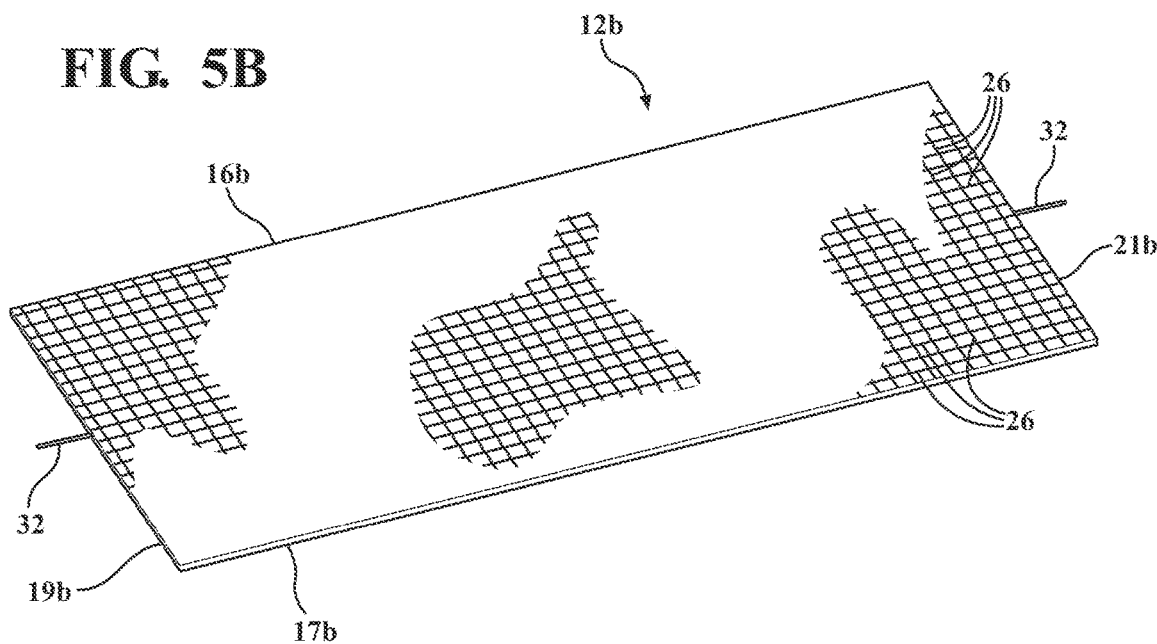
FIG. 5B is a perspective view of a woven inner layer in accordance with another aspect of the disclosure shown prior to being fixed to an outer layer.

The inner layer 12b can include the conductive filaments 26 interlaced with non-conductive filaments 30. In accordance with one aspect of the disclosure, the interlacing used to construct the inner layer 12b can include weaving the conductive filaments 26 with the non-conductive filaments 30, as shown in FIGS. 3A and 5A. The non-conductive filaments 30 can be provided as monofilaments and/or multifilaments. Otherwise, the inner layer 12b can be woven entirely with the conductive filaments 26, as shown in FIG. 5B. In accordance with another aspect of the disclosure, the interlacing used to construct the inner layer 12b can include braiding the conductive filaments 26 with the non-conductive filaments 30, as shown in FIGS. 3B and 4A. The non-conductive filaments 30 can be provided as monofilaments and/or multifilaments. Otherwise, the inner layer 12b can be braided entirely with the conductive filaments 26, as shown in FIG. 4B.

The woven outer layer 12a and the textile inner layer 12b are fixed to one another against separation from one another. In accordance with one aspect of the disclosure, the woven outer layer 12a and the textile inner layer 12b are stitched to one another adjacent their respective opposite outer edges 16a, 17a and opposite inner edges 16b, 17b. The stitching can be formed along the entire length of the opposite edges 16, 17.

The sleeve 10 can further include a drain wire 32 fixed to the textile inner layer 12b in electrical communication with the conductive filaments 26. In accordance with another aspect of the disclosure, the drain wire 32 extends outwardly from at least one of the opposite ends 19, 21 of the sleeve 10 for grounding the sleeve 10 to a suitable source of ground (not shown). The drain wire 32 can be interlaced with the inner layer 12b during construction of the inner layer 12b in the weaving or braiding process.

In accordance with another aspect of the invention, a method of constructing a self-wrapping, abrasion and EMI resistant sleeve 10 for routing and protecting an elongate member 14 is provided. The method includes weaving warp filaments 22 with weft filaments 24 to form an outer layer 12a having opposite outer edges 16a, 17a extending lengthwise between opposite ends 19a, 21a, with the warp filaments 22 extending generally parallel to the opposite edges and the weft filaments 24 extending generally transversely to the warp filaments 22. Further, interlacing filaments to form a textile inner layer 12b having opposite inner edges 16b, 17b extending lengthwise between opposite ends 19b, 21b, with at least some of the filaments of the textile inner layer 12b including conductive filaments 26 interlaced electrical communication with one another. Further yet, fixing the outer layer 12a to the inner layer 12b to form a wall 12, and, wrapping the wall 12 about a central longitudinal axis 18 to bring the opposite outer edges 17a, 17b into overlapping relation with the opposite inner edges 16a, 16b. Then, heat-forming the weft filaments 24 of the woven outer layer 12a to maintain the opposite outer edges 17a, 17b and the opposite inner edges 16a, 16b in biased overlapping relation with one another.

In accordance with another aspect of the invention, the method can further include weaving the outer layer 12a entirely with non-conductive filaments 28.

In accordance with another aspect of the invention, the method can further include forming the textile inner layer 12b by interlacing the conductive filaments 26 of the inner layer 12b with non-conductive filaments 30.

In accordance with another aspect of the invention, the method can further include interlacing the conductive filaments 26 of the inner layer 12b with non-conductive filaments 30 in a braiding process.

In accordance with another aspect of the invention, the method can further include interlacing the conductive filaments 26 of the inner layer 12b with non-conductive filaments 30 in a weaving process.

In accordance with another aspect of the invention, the method can further include forming the textile inner layer 12b entirely with the conductive filaments 26.

In accordance with another aspect of the invention, the method can further include interlacing the inner layer 12b formed entirely with conductive filaments 26 in a weaving process.

In accordance with another aspect of the invention, the method can further include interlacing the inner layer 12b formed entirely with conductive filaments 26 in a braiding process.

In accordance with another aspect of the invention, the method can further include providing the conductive filaments 26 as non-conductive monofilaments and/or multifilaments coated with a conductive material, such as a conductive metal coating.

Obviously, many modifications and variations of the present invention are possible in light of the above teachings. It is contemplated that all features of all claims and of all embodiments can be combined with each other, so long as such combinations would not contradict one another. It is, therefore, to be understood that within the scope of the appended claims, the invention may be practiced otherwise than as specifically described.

What is claimed is:

1. A self-wrapping, abrasion and EMI resistant sleeve for routing and protecting an elongate member, comprising:
 a woven outer layer having opposite outer edges extending lengthwise between opposite ends of said woven outer layer, said woven outer layer having warp filaments extending generally parallel to said opposite edges and weft filaments extending generally transversely to said warp filaments; and a textile inner layer having opposite inner edges extending lengthwise between opposite ends, said textile inner layer having conductive filaments interlaced with one another in electrical communication with one another, wherein said weft filaments of said woven outer layer are heat-formed to bias said opposite outer edges and said opposite inner edges into overlapping relation with one another.

2. The self-wrapping, abrasion and EMI resistant sleeve of claim 1, wherein said woven outer layer is woven entirely with non-conductive filaments.

3. The self-wrapping, abrasion and EMI resistant sleeve of claim 2, wherein said conductive filaments of said inner layer are braided with non-conductive filaments.

4. The self-wrapping, abrasion and EMI resistant sleeve of claim 3, wherein said non-conductive filaments of said inner layer are monofilaments.

5. The self-wrapping, abrasion and EMI resistant sleeve of claim 3, wherein said non-conductive filaments of said inner layer are multifilaments.

6. The self-wrapping, abrasion and EMI resistant sleeve of claim 2, wherein said textile inner layer is interlaced entirely with conductive filaments.

7. The self-wrapping, abrasion and EMI resistant sleeve of claim 2, wherein said non-conductive filaments of said woven outer layer include monofilaments.

8. The self-wrapping, abrasion and EMI resistant sleeve of claim 7, wherein said non-conductive filaments of said woven outer layer include multifilaments.

9. The self-wrapping, abrasion and EMI resistant sleeve of claim 8, wherein said weft filaments are provided entirely as said monofilaments and said warp filaments are provided including said multifilaments.

10. The self-wrapping, abrasion and EMI resistant sleeve of claim 7, wherein said non-conductive filaments of said woven outer layer are entirely monofilaments.

11. The self-wrapping, abrasion and EMI resistant sleeve of claim 1, wherein said conductive filaments are non-conductive filaments coated with a conductive coating.

12. The self-wrapping, abrasion and EMI resistant sleeve of claim 1, wherein said woven outer layer and said textile inner layer are stitched to one another adjacent the opposite outer edges and the opposite inner edges.

13. The self-wrapping, abrasion and EMI resistant sleeve of claim 1, further including a drain wire fixed to said textile inner layer in electrical communication with said conductive filaments.

14. The self-wrapping, abrasion and EMI resistant sleeve of claim 13, wherein said drain wire extends outwardly from at least one of said opposite ends.

15. A method of constructing a self-wrapping, abrasion and EMI resistant sleeve for routing and protecting an elongate member, comprising:
weaving warp filaments with weft filaments to form an outer layer having opposite outer edges extending lengthwise between opposite ends, with the warp filaments extending generally parallel to the opposite edges and the weft filaments extending generally transversely to the warp filaments;
interlacing filaments to form a textile inner layer having opposite inner edges extending lengthwise between opposite ends, with at least some of the filaments including conductive filaments interlaced electrical communication with one another;
fixing the outer layer to the inner layer to form a wall;
wrapping the wall about a central longitudinal axis to bring the opposite outer edges into overlapping relation with the opposite inner edges; and
heat-forming the weft filaments of the woven outer layer to maintain the opposite outer edges and the opposite inner edges in biased overlapping relation with one another.

16. The method of claim 15, further including weaving the outer layer entirely with non-conductive filaments.

17. The method of claim 16, further including forming the textile inner layer by interlacing the conductive filaments of the inner layer with non-conductive filaments.

18. The method of claim 17, further including interlacing the conductive filaments of the inner layer with non-conductive filaments in a braiding process.

19. The method of claim 17, further including interlacing the conductive filaments of the inner layer with non-conductive filaments in a weaving process.

20. The method of claim 16, further including forming the textile inner layer entirely with the conductive filaments.

\* \* \* \* \*